(12) United States Patent
Benbrahim

(10) Patent No.: US 8,213,164 B2
(45) Date of Patent: Jul. 3, 2012

(54) QUICK MOUNTING SYSTEM AND MEDIA FOR VIDEO RECORDING

(76) Inventor: Jamal Benbrahim, Reno, NV (US)

( * ) Notice: Subject to any disclaimer, the term of this patent is extended or adjusted under 35 U.S.C. 154(b) by 344 days.

(21) Appl. No.: 12/717,849

(22) Filed: Mar. 4, 2010

(65) Prior Publication Data

US 2011/0216496 A1 Sep. 8, 2011

(51) Int. Cl.
*H05K 5/00* (2006.01)
*H05K 7/00* (2006.01)

(52) U.S. Cl. .......... 361/679.02; 361/679.01; 361/679.31

(58) Field of Classification Search ............. 361/679.01, 361/679.02, 679.31
See application file for complete search history.

(56) References Cited

U.S. PATENT DOCUMENTS

| | | | |
|---|---|---|---|
| 5,969,953 A | 10/1999 | Purdom et al. | |
| 6,567,273 B1 * | 5/2003 | Liu et al. | 361/737 |
| 6,706,966 B2 * | 3/2004 | Browning et al. | 174/542 |
| 6,979,210 B2 * | 12/2005 | Regen et al. | 439/131 |
| 7,125,265 B2 * | 10/2006 | Weng | 439/131 |

* cited by examiner

*Primary Examiner* — Anthony Haughton
(74) *Attorney, Agent, or Firm* — Weide & Miller, Ltd.

(57) ABSTRACT

A mounting system comprising a base and a media module for mounting and dismounting of storage media is disclosed herein. In general, the mounting system allows one or more media modules to be rapidly mounted and dismounted to and from various devices. The media module may comprise an enclosure for storing the storage media and a rotatable cap with an open portion to accept the enclosure. The enclosure may have one or more media guides and the cap may have one or more locking guides. The media guides may engage one or more pins of the base to align the enclosure with the base. This allows a communications connection to be formed between the storage media and a device. The locking guides may engage the pins to mount the enclosure to the base as the cap is rotated.

20 Claims, 10 Drawing Sheets

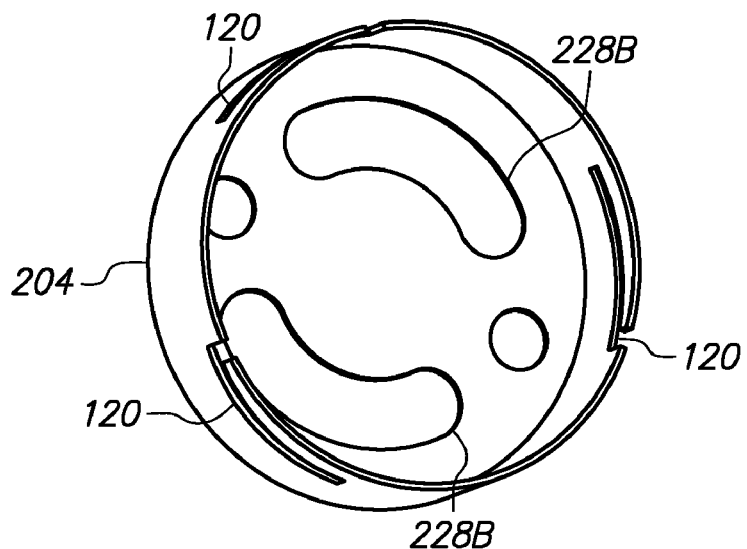
FIG. 2B
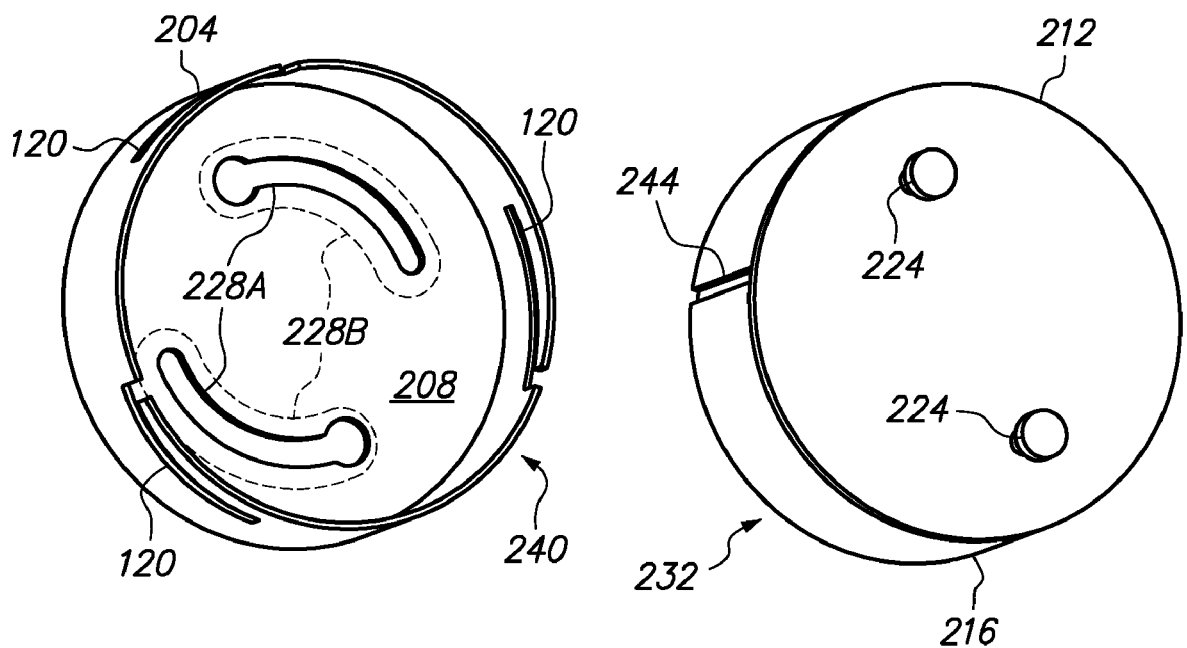
FIG. 2C
FIG. 2D

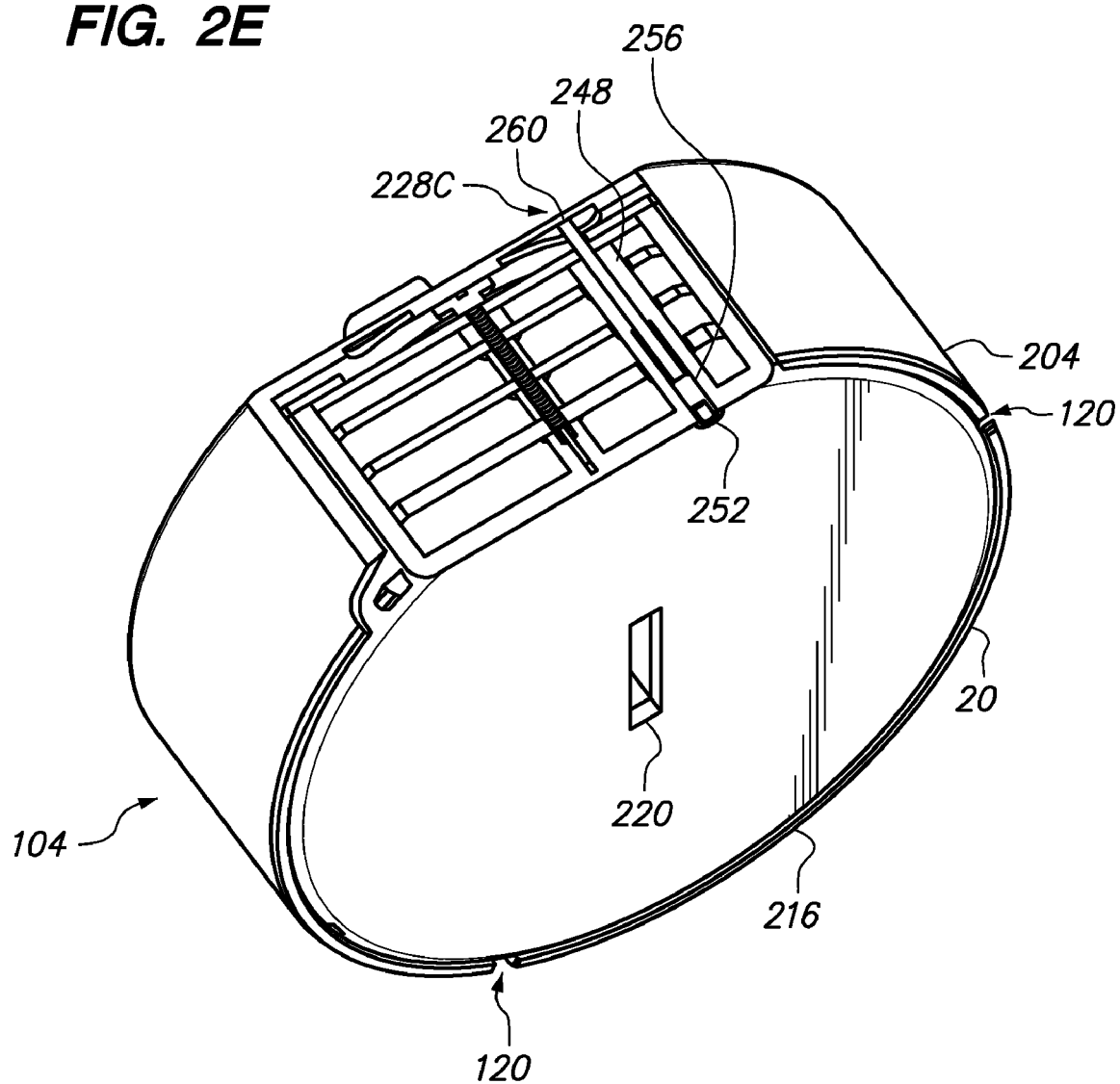

QUICK MOUNTING SYSTEM AND MEDIA FOR VIDEO RECORDING

BACKGROUND OF THE INVENTION

1. Field of the Invention

The invention relates to storage media, particularly to a quick mounting system and media for video and other recordings.

2. Related Art

Historically, the television and film industry has relied on chemical film to record motion pictures and other videos recordings. This process has a number of disadvantages in that it requires the use of chemical processing which introduces delays between the time footage is recorded and the time the footage may be reviewed. It is also costly to purchase the file media itself and the post processing is expensive and time consuming. In recent years, the industry has moved away from chemical film and started utilizing digital media to record video footage to reduce the time between recoding and reviewing of footage and to realize other benefits.

In both chemical film and digital media, large volumes of media are used during filming. Even in digital media, the volume of media consumed may be so large that in some cases that attempts have been made to record motion pictures on remote storage devices. This requires a video camera to be tethered to a storage device by one or more data transmission cables. As can be appreciated, this arrangement is cumbersome to the camera man and even with high speed connections, the transfer of digital data from one device to another consumes a substantial amount of time.

While some attempts have been made to utilize digital media contained within a camera, such attempts have been unsuccessful except perhaps in simple consumer applications. In addition to such cameras not containing enough media, the transfer process from the media to post processing is too slow and would prevent use of the camera during the transfer.

From the discussion that follows, it will become apparent that the present invention addresses the deficiencies associated with the prior art while providing numerous additional advantages and benefits not contemplated or possible with prior art constructions.

SUMMARY OF THE INVENTION

A mounting system for rapidly mounting and dismounting storage media to various devices, such as video equipment, is disclosed herein. The mounting system allows data files, even large data files, to be quickly moved from one device to another while generally avoiding the time-consuming task of electronically transferring data between devices. The mounting system also allows storage media to be rapidly mounted to a single device. For example, a user may rapidly replace storage media for a video camera as the storage media is filled or otherwise used.

The mounting system for storage media may have a variety of configurations. In one exemplary embodiment, the mounting system may comprise a storage media having one or more connectors and configured to store data, an enclosure comprising one or more media guides for storing the storage media, and a cap comprising one or more locking guides and an open portion configured to accept at least a portion of the enclosure. The cap will typically be rotatably mounted to the enclosure. It is noted that the enclosure may comprise one or more openings to allow the one or more connectors or one or more device connectors to pass therethrough The media guides may be configured to engage one or more pins to align the connector of the storage media with the device connector. The locking guides may be configured to engage the pins to mount the enclosure to a device. The locking guides may comprise a first portion and a second portion. The first portion may be configured to align with at least a portion of the media guides. The second portion may be angled relative to the first portion, or the second portion may be curved to allow the cap to secure the enclosure to a base or a device. The one or more media guides may be straight to guide the storage media's connector to properly connect with the device connector.

A base configured to accept at least a portion of the cap may be provided as well. It is noted that the device connector may be located at the base. In addition, the one or more pins may extend from a portion of the base. In this manner, rotating the cap mounts the enclosure to the base via the pins of the base and the locking guides of the cap. It is noted that the cap may be cylindrical in shape.

A connecting plate attached to an interior portion of the cap may be provided, to rotatably mount the cap to the enclosure. The connecting plate may comprise one or more curved channels. The enclosure may comprise one or more connecting pins which engage the curved channels. The one or more curved guides may then guide the rotation of the cap relative to the enclosure. In this manner, the one or more curved channels may engage the one or more connecting pins to rotatably mount the cap to the enclosure.

In another exemplary embodiment, the mounting system for storage media may comprise an enclosure configured to store a storage media, and one or more media guides on an outer surface of the enclosure. The one or more media guides may be configured to align a connector of the storage media with a device connector, and to guide the connector to the device connector to form a communication connection between the connector and the device connector. The media guides may be straight.

The mounting system may also comprise a cap having an open portion to accept the enclosure, and one or more locking guides. The one or more locking guides may have a first portion configured to align with the one or more media guides and a second portion configured to secure the enclosure to a base. The second portion of the one or more locking guides may be angled relative to the first portion of the one or more locking guides. A mount between the cap and the enclosure may also be provided. The connecting mount may be configured to rotatably mount the cap to the enclosure, with the enclosure being mounted within the open portion of the cap.

A base may be provided in as well. For example, the mounting system may comprise a base comprising a coupler having one or more pins extending therefrom. The coupler may be configured to accept at least a portion of the cap and the enclosure. The pins of the coupler may be configured to engage the media guides to align and guide the connector to the device connector, and to engage the locking guides to mount the enclosure to the base. The base may be included in or be part of various devices. For example, the base may be part of video equipment, such as cameras, computers, editing stations, media readers, video projectors, and display screens. It is noted that the base may be configured to store or hold a media module to another structure. For example, at least one base may be attached to a harness, such as a belt or the like, configured to be worn by a user.

An exemplary method of mounting a storage media to an electronic device is disclosed herein as well. In one embodiment, the method may comprise aligning one or more media guides of an enclosure of a media module with one or more pins of a base, aligning at least a portion of one or more locking guides of a cap of the media module with the pins of the base, and inserting at least a portion of the cap into a portion of the base. A first portion of the locking guides and the media guides may engage the pins during insertion.

The cap may be rotated in a first direction to move the pins into a second portion of the locking guides to mount the enclosure to the base. In general, the cap may be rotated relative to the base and the enclosure. The enclosure may be guided into the base by the media guides. In this manner, a connector of the enclosure may be guided to a device connector of the base to form a communication connection between the connector and the device connector.

It is noted that rotating the cap in the first direction may comprise moving the one or more pins into an angled second portion of the one or more locking guides. Alternatively or in addition, rotating the cap in the first direction may comprise moving the one or more pins into a curved second portion of the one or more locking guides.

The method may include a method for dismounting the storage media from the electronic device. Dismounting the storage media may comprise rotating the cap in a second direction to move the pins out of the second portion of the locking guides, and removing the one or more pins from the locking guides and the media guides. Typically, the second direction will be opposite of that of the first direction.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 2B is a bottom perspective view of an exemplary cap;

FIG. 2C is a bottom perspective view of an exemplary cap and connecting plate;

FIG. 2D is a perspective view of an exemplary cover;

FIG. 2E is a cross-sectional view of an exemplary locking assembly;

DETAILED DESCRIPTION OF THE PREFERRED EMBODIMENTS

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

In general, the storage media and mounting system herein utilize solid-state media, such as flash memory, to record data. Of course, other types of storage media may be used with the mounting system, such as disks, RAM drives, solid state disks (SSDs), memory modules and the like, or another type of memory developed in the future. Though described herein as recording or storing video, it will be understood that a variety of data may be stored for later access on the storage media and mounting system. The mounting system may be used by professional and non-professional users.

In one or more embodiments, the mounting system provides the benefit of improving the way storage media is mounted to various devices and used by such devices. As will be described further below, the mounting system may be configured to allow quick and easy removal/replacement of storage media, locking of media to prevent changes to the data thereon, and high performance storage and retrieval of video, among other things.

The mounting system may be used with a variety of electronic devices that may read, write, or otherwise access electronically stored data. As will be described further below, the mounting system may be used by video equipment/devices, such as video recording, editing, and other video production equipment.

Traditionally, video has been recorded on tape media, magnetic media, and flash media. These traditional media must be swapped or their data transferred to another storage medium frequently, especially in movie and film production, because of the enormous quantity of footage being recorded. For example, during a video shoot, 700 Gigabytes of data storage may be required to record 1 hour of video. This is a problem because swapping of media and data transfers take time to complete. Indeed, this is highly undesirable because it renders a camera (or other video recording device) unusable thus extending shooting times thus leading to increased costs for movie and film productions.

At some point even the largest capacity storage media will become full. Thus, the mounting system herein is highly advantageous in that it reduces the time it takes to remove/replace storage media. This is especially the case where a camera or other video recording device is capturing a live event. Where the event is not live, this is advantageous in that it reduces camera or video recording downtime.

Figure 1:
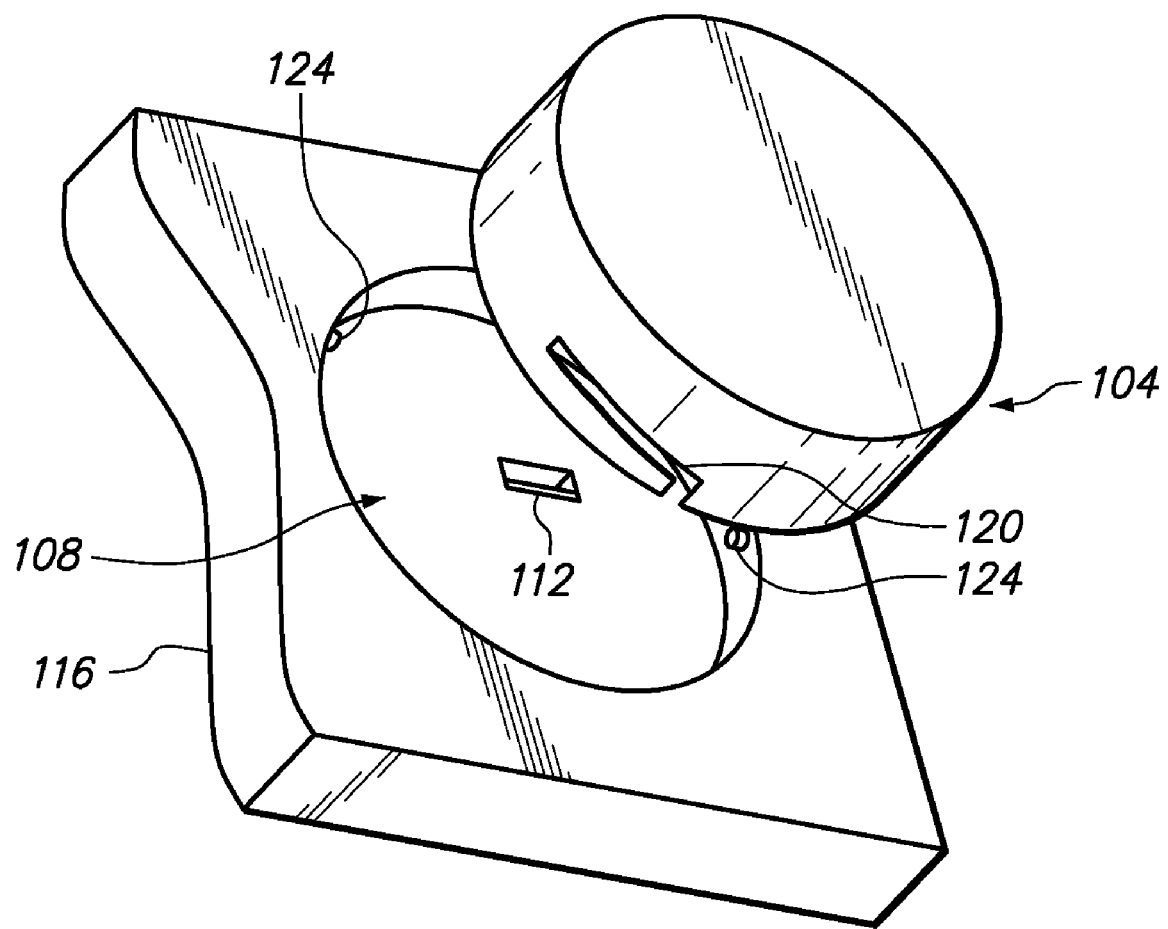
FIG. 1 is a perspective view of an exemplary mounting system.

The mounting system will now be described with regard to FIG. 1. FIG. 1 is a perspective view of an exemplary mounting system comprising a removable media module 104 and a base 116 to which the media module may be mounted. The base 116 may comprise a coupler 108 to accept the media module 104. The base 116 is shown generically here as it may be part of a camera, editing device, playback device, display device (e.g., a video screen/projector), storage device, external media reader, or any other device configured to access or otherwise use data storage.

An electrical connector 112 may be associated with the base 116, such as shown in FIG. 1, to send/receive data to/from the media module 104. In general, the electrical connector 112 will be a connector or port of the device utilizing the media module 104. As will be discussed below, the base 116 may be part of or attached to various devices that can use the media module 104. Any type electrical or optical connector may be adopted for use and as such, the electrical connector should be considered broadly as a device connector 112.

The base 116, media module 104, or both may be configured to allow rapid mounting and removal of recordable media to and from various devices. For example, storage media may be quickly installed for use by a video camera, other recording equipment, editing equipment, viewing equipment, or the like. This also allows storage media to be quickly swapped which provides the advantage of continuous or near continuous recording/filming.

As will be described further below, the base 116, media module 104, or both may include one or more pins, guides, channels, and/or other like structures to allow a connection with the electrical connector 112 to be made quickly and easily. For example, in FIG. 1, the base 116 comprises a coupler 108 comprising an indented portion which is configured to accept at least a portion of the media module 104. As can be seen, the shape of the indent helps align and guide the media module 104 as it is installed. In one or more embodiments, the coupler 108 may be circular or round to allow rotation of at least a portion of the media module 104, as will be described further below.

The embodiment of FIG. 1 also illustrates elements of the base 116 and media module 104 that may be used to align or otherwise guide the media module 104 to properly connect with the device connector 112. For example, the base 116 may have a coupler 108 comprising one or more pins 124. As will be described further below, the pins 124 may work in conjunction with various guides, such as locking guides 120, of the media module 104. The guides may be configured such that the media module 104 must be at one or more particular orientations, i.e. keyed, to be inserted or mounted to a base 116. It will be understood that in some embodiments, an alternate configuration may be used where the pins 124 extend from the media module 104 and the guides are formed into the coupler 108 or base 116.

At least one of the guides 120 may be configured to secure or mount the media module 104 to a base 116. In one embodiment, three guides 120 secure the mount to the media module. To illustrate, the locking guides 120 of the media module 120 may have an open end which accepts the one or more pins 124 when the media module 120 is properly aligned with the coupler 108 or base 116. The locking guides 120 may be various shapes. The locking guides 120 may include various bends, angles, notches and/or curves and the like such as shown in FIG. 1. For example, a first portion of a locking guide 120 may be angled or curved relative to a second portion of the locking guide. In this manner, when rotated, the locking guides 120 and pins 124 secure the media module 104 tightly to the base 116, as will be discussed further below. This is beneficial in ensuring the media module 104 is held securely and ensuring that a proper communications connection with the device connector 112 is made and maintained.

Though shown as passing through a wall of the media module 104, it is noted that one or more locking guides 120 may be formed as grooves on the surface of a media module which do not pass the surface of the media module. These grooved locking guides 120 may be used to guide the media module as it is secured to the base 116.

It will be understood that a variety of device connectors 112 may be used in the mounting system. This includes electrical and optical connectors. It is contemplated that a device connector 112 may be configured to accept physical connections and/or wireless connections. For example, the device connector 112 may be configured to accept a physical electrical or optical connector. As another example, the device connector 112 may be configured to accept an infrared, radio frequency, or other wireless connection.

The benefits of the mounting system apply to both physical and wireless connections. As stated, the mounting system helps align the media module 104 for a proper and secure connection to the device connector 112. The mounting structure may also do the same for wireless connections. For example, an infrared or optical connection may require alignment between the device connector 112 and the media module 104. Equipping the device with an optical or infrared connection reduces or eliminates the electrical contacts that can wear out or break. The guide structures, such as those described above and herein, may be used to ensure that there is proper alignment.

Figure 2A:
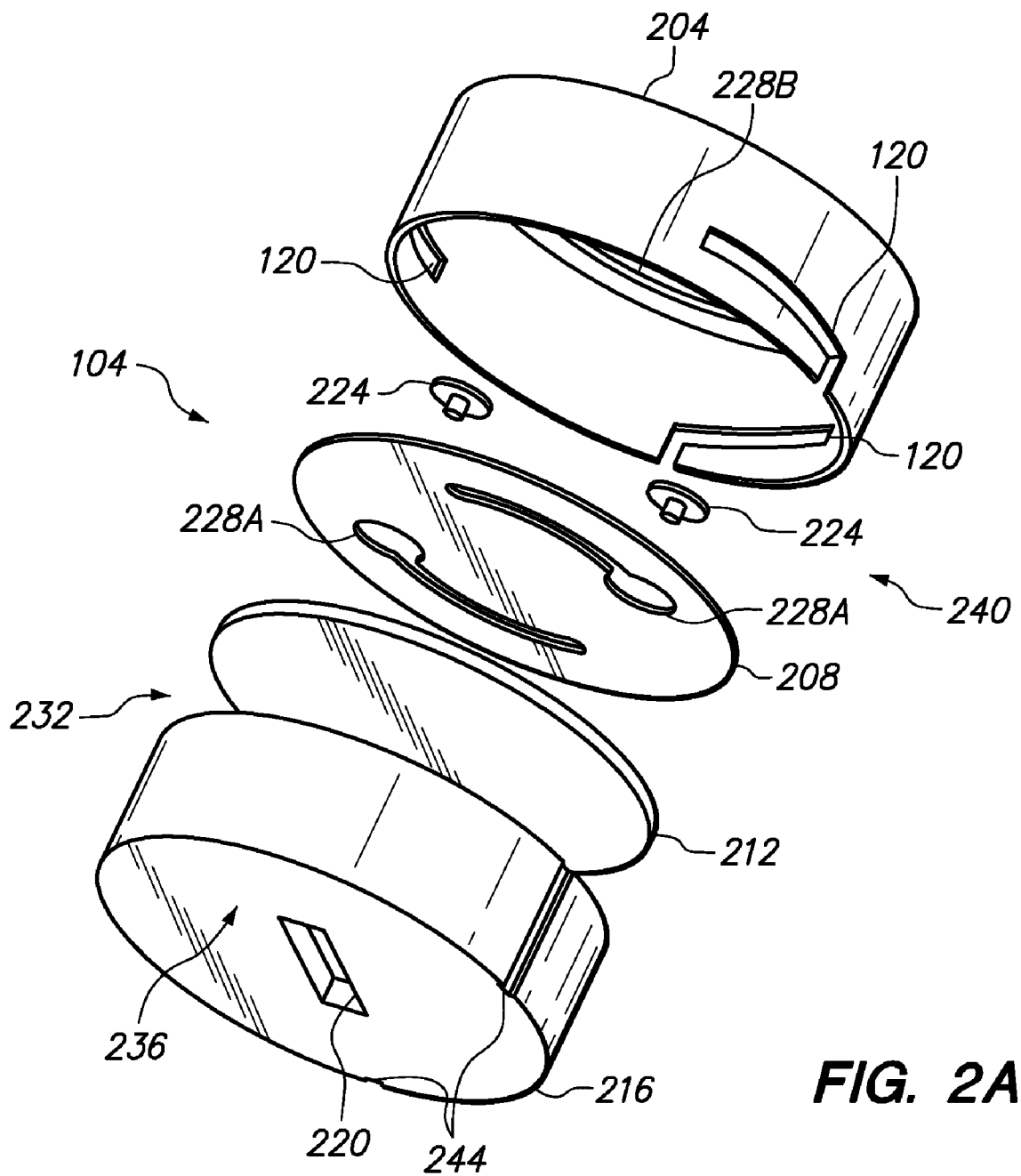
FIG. 2A is an exploded perspective view of an exemplary media module.

The media module will now be further described with regard to FIGS. 2A-2B. In general, the media module 104 is configured to enclose or otherwise store a storage media 236, such as within an enclosure 216. It is noted that the storage media 236 may comprise associated hardware which may also be housed or stored in the media module 104 as will be described further below.

The media module 104 may have various elements which store or secure the storage media 236 and/or associated hardware as well as elements which aid in quick installation and removal of the media module 104 from a coupler or base. In addition, the media module 104 may have elements which ensure the storage media 236 properly connects to or interfaces with a device connector.

In one or more embodiments, the media module 104 may include one or more rotating elements, which twist or turn to secure the media module to a coupler. Other portion(s) of the media module 104 may remain stationary to allow the storage media 236 to remain properly connected to a device connector even as rotating elements of the media module are rotated or otherwise moved to secure or release the media module to or from a coupler.

Referring to FIG. 2A, it can be seen that the media module 104 may comprise a media assembly 232 and a locking assembly 240. In general, the media assembly 232 is configured to store or house storage media 236 and any associated hardware. For example, the media assembly 232 may house flash or other memory in some embodiments. The media assembly 232 may house or support the storage media 236 therein and be configured as an enclosure to protect or cover the media. In general, the locking assembly 240 is configured to secure the media module 104 to a base or coupler, as will be described further below.

In one or more embodiments, the locking assembly 240 may be circular to allow it to rotate when engaged to a base. For example, as shown the locking assembly 240 has a cylindrical shape which may correspond to a coupler of a base. The media assembly 232 may have a circular or cylindrical shape as well in one or more embodiments, though this is not required in all embodiments as long as the locking assembly 240 may rotate relative to the media assembly 232.

The media assembly 232 may be configured in a variety of ways. For example, as shown in FIG. 2A, the media assembly 232 comprises an enclosure 216 and a cover 212. In general, the enclosure 216 defines a protected space in which storage media 236 and any associated hardware may be housed. The enclosure 216 may have an open end or section in some embodiments. This allows the storage media 236 and associated hardware to be installed, maintained, replaced, and removed easily.

The open section or end of the enclosure 216 will typically be covered. For example, the enclosure 216 may have its open section covered by the cover 212. This better encloses the storage media 236 and any associated hardware. The cover 212 may be permanently attached to or be part of the enclosure 216, such as to seal the storage media 236 in the enclosure, or may be removably attached to the enclosure, such as to allow removal, repair, or replacement of the storage media and/or associated electronics.

In one or more embodiments, the enclosure 216 may have one or more openings of various shapes and sizes. For example, the enclosure 216 (or other portion of the media assembly 232) may have an opening 220 to allow a communications connection (e.g., an electrical or optical connection) to be made between the storage media 236 and an external device connector or the like. It is contemplated that both male and female connectors may be used with the enclosure 216 and thus the connectors may extend from or be recessed within the enclosure in one or more embodiments. Though illustrated centrally in the media assembly 232, it is noted that an opening 220 may be at various locations. For example, an opening 220 may be of center or near the edges of the media assembly 232.

The media assembly 232, or a portion thereof (such as the enclosure), may include elements which guide or help orient or align the media assembly such that a proper communications connection can be quickly and easily made. For example, as shown in FIG. 2A, the enclosure 216 comprises media guides 244 which help ensure that the media assembly is rotated to a position that allows a communication connection between the storage media 236 in the assembly and an external device connector. The media guides 244 may be configured to correspond to pins or protrusions of a base or coupler, such as described above, to properly align the media assembly when mounted. It is noted that one or more media guides 244 may be provided, that the media guides and corresponding protrusions may have various cross sectional shapes, and that the media guides 224 may extend to various lengths along the media assembly 232.

In one embodiment, the media guides 244 may be spaced along the edge of the media assembly 232 such that the media assembly must be rotated to a particular position in order to allow the pins or protrusions to align with the media guides, thus allowing the media assembly to be mounted. In another embodiment, the media guides 244 of a media assembly 232 may have different cross sectional shapes. In this manner, the media assembly 232 must also be oriented at a particular angle to align pins/protrusions of various shapes with their media guides 244 of a corresponding shape.

It is noted that the media guides 244 may have various configurations. For example, the media guides 244 may be configured as depressions or holes in the enclosure 216 designed to accept a pin or protrusion extending from a portion of the base 116, such as a coupler 108 of the base. It is contemplated that the pin/protrusion may extend from the enclosure 216 and that the depression/hole may be in the base 116 in some embodiments.

The locking assembly 240 may be configured in a variety of ways. As stated, the locking assembly 240 may be configured to secure the media module 104 to a base or coupler, as will be described further below. In one or more embodiments, the locking assembly 240 may comprise a locking cap 204 which may be used to secure the media assembly 232 and/or storage media 236 in place. For instance, the cap 204 may have one or more locking guides 120 which accept one or more pins of a base to secure the cap (and thus the media assembly 232 and enclosure 216) in place, such as described above with regard to FIG. 1.

As can be seen, the cap 204 may comprise an open portion configured to accept the media assembly 232. In this manner, the media assembly 232 may be mounted within the cap 204. This allows the cap 204 to be used to secure or mount the media assembly 232 to a base. The open portion may correspond to the shape of the media assembly 232 in one or more embodiments. For example, the open portion may be circular in one or more embodiments. It is contemplated that the open portion may have a depth such that, when the media assembly 232 is mounted within the cap 204, the bottom surface of the media assembly 232 is flush with the bottom surface of the cap 204. This flush mounting may be used to help ensure a proper communication connection between a storage media's connector and a device connector. Of course, the open portion may be various depths and, rather than being flush with the cap 204, the media assembly 232 may extend out of or be within the cap.

The locking assembly 240 may also include a connecting plate 208 or mount which may be used to rotatably connect the locking assembly 240 to the media assembly 232. For example, the cap 204 may be rotatably mounted to the enclosure 216 of the media module 104 by a connecting plate 208 or mount. This is highly advantageous in that it allows the media assembly 232 to remain connected to a device connector of the base even as the locking assembly 240 or a portion thereof, such as the cap 204, is being rotated.

A rotatable connection may be achieved in a variety of ways. For example, in the embodiment of FIG. 2A, the connecting plate 208 may be attached to an interior portion of the cap 204. The connecting plate 208 may comprise one or more channels 228A, which, in conjunction with one or more connecting pins 224 allow the locking assembly 240 to rotate. To illustrate, the one or more connecting pins 224 may be attached to or extend from the media assembly 232, such as from the media assembly's cover 212 as can be seen from FIG. 2D. The connecting pins 224 may extend into one or more channels 228A of the connecting plate 208. Because the channels 228A may be curved, such as shown in FIG. 2A, the connecting pins 224 and channels, when engaged, guide the locking assembly 240 in a circular or rotational movement.

The locking assembly 240 may be secured to the media assembly 232 in one or more embodiments. In general, this allows the locking assembly 240 to rotate relative to the media assembly 232 without becoming disconnected from the locking assembly 240. This may be accomplished in a variety of ways. For example, the connecting pins 224, channels 228A, or both may be configured to hold the locking assembly 240 and media assembly 232 together. To illustrate, in FIG. 2A, the connecting pins 224 have an enlarged head and a narrower body. The channels 228A have been sized to accept the body of the connecting pins 224, with a portion of the channels being enlarged to accept the enlarged head of the connecting pins 224. The enlarged portion allows the connecting pins 224 to be inserted into the channels 228A. When moved or rotated, the bodies of the connecting pins 224 enter a narrower portion of the channels 228A. In the narrower portion of the channels 228A may be too narrow for the head of the connecting pins 224 to fit through. In this manner, the connecting pins 224 cannot be removed from the channels 228A while in the narrower section of the channels.

It is contemplated that the cap 204 may comprise one or more channels 228B or grooves in some embodiments. These channels 228B may be configured to accept the connecting pins 224 as well. These channels 228B may also be configured to guide the connecting pins 224. This is beneficial in that the additional support or guidance for the connecting pins 224 provides a smoother and/or more reliable rotation of the locking assembly 240. As shown in FIG. 2B, for instance, the cap 204 includes channels 228B that accept a portion of the connecting pins 224, namely the head portion of the pins. The channels 228B have been curved similar to the curve of the connecting plate's channels 228A to guide the locking assembly 240 in a circular or rotational movement relative to the media assembly 232. In this embodiment, the channels 228B have been inset into the cap 204. This allows the connecting plate 208 to be mounted flush to the surface of the cap 204, such as shown in FIG. 2C.

In this embodiment, the head portion of the connecting pins 224 may be snugly held between the connecting plate 208 and the cap 204. This is advantageous because the connecting pins 224 are then supported and guided both at their body and their head portions. To illustrate, the bodies of the connecting pins 224 are guided by the channels 228A of the connecting plate 208 while the heads of the pins are guided by the channels 228B of the cap (when the media module is assembled). This provides a smoother high quality rotation that is also rugged and reliable. It is noted that the combination of channels 228A and channels 228B may be integrally formed in some embodiments. In these embodiments, a separate connecting plate 208 may not be necessary or provided. For example, one or more channels corresponding to the combination of channels 228A and channels 228B may be machined or otherwise formed from a single piece of material in one or more embodiments.

Though it can be seen from the above that the connecting plate 208 may hold the locking assembly 240 to the media assembly 232, it may also be seen that the locking assembly 240 may be disengaged from the media assembly 232 by rotating or moving the locking assembly, media assembly, or both such that the enlarged heads of the connecting pins 224 are positioned at the enlarged portions of the channels 228A. This is advantageous in that, if necessary or desired, the locking assembly 240 can be removed. For example, the user may wish to replace a broken or lower capacity media assembly 232 with one that works or with one that has additional storage capacity. It is also contemplated that additional memory may be added to the device.

It is contemplated that the locking assembly 240 may be prevented from disengaging the media assembly 232 in one or more embodiments. For example, a restrictor assembly may be provided to prevent the locking assembly 240 and media assembly 232 from rotating to an extent where they would become disengaged from one another. The restrictor assembly may be configured in various ways. For example, in one or more embodiments, the restrictor assembly may comprise a keyed or other locking member which may be inserted to prevent the heads of the connecting pins 224 to be positioned at the enlarged portions of the channels 228A. The locking member may be removable in one or more embodiments, to allow the locking assembly 240 to disengage the media assembly 232, such as for the repair or upgrade reasons described above.

FIGS. 2E-2H illustrate an exemplary restrictor assembly configured to prevent the locking assembly from disengaging the media assembly. Referring to FIG. 2E, it can be seen that a locking member 260 may extend between the enclosure 216 and cap 204. The locking member 260 may be a pin or other structure which contacts a portion of the cap 204 to prevent disengagement. For example, as can be seen, a portion of the locking member 260 engages at least one restrictor channel 228C of the cap 204 to prevent the enclosure 216 and cap 204 from rotating such that the connecting pins 224 may be released from the channels 228A.

As stated, in one or more embodiments, the locking member 260 may be removable or disengaged. This may occur by retracting or otherwise moving the locking member 260 such that it no longer serves to physically restrict rotation of the enclosure 216 and cap 204 relative to one another. For example, a restrictor assembly may include a screw or other retention device 252 that may be used to hold the locking member 260 in place, while also allowing the locking member to be disengaged when desired. It is noted that, though not required, a spring or other biasing device 256 may be included in some embodiments to ensure the locking member 260 remains engaged to a channel 228C when in use.

Figure 2F:
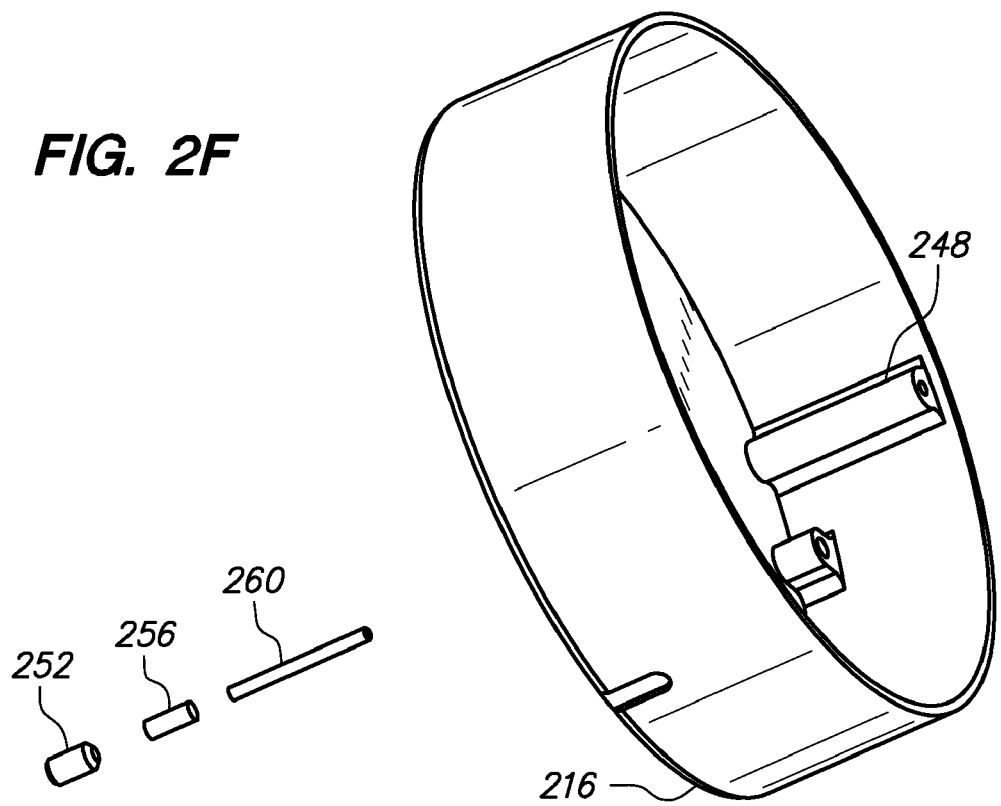
FIG. 2F is an exploded perspective view of an exemplary locking assembly.

The locking member 260 may be supported by a support 248 of a restrictor assembly in one or more embodiments. In general, the support 248 secures the locking member 260 in position relative to the cap 204 as can be seen in FIGS. 2E-2F. For example, the support 248 may be attached to the enclosure 216 in one or more embodiments. The support 248 may be a structure configured to accept the locking member 260. For example, the support 248 illustrated has a tube-like structure configured to accept the locking member 260. In one or more embodiments, the locking member 260 may be movable relative to or within the support 248 to allow the locking member to be removed or disengaged, such as described above.

Figure 2G:
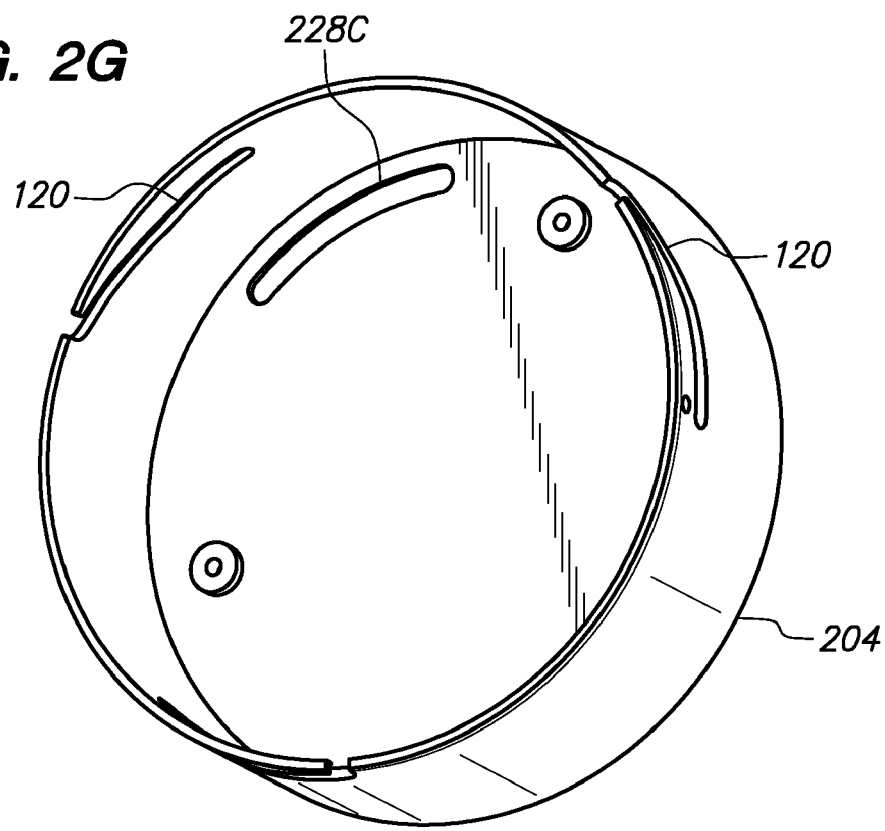
FIG. 2G is a perspective view of an exemplary cap.

In operation, the restrictor assembly generally limits rotation but does not prevent all rotation. This may be achieved in various ways. FIG. 2G illustrates a cap 204 having a restrictor channel 228C that has been curved to allow rotation of a media assembly relative to a locking assembly. The restrictor channel 228C allows the locking member to move therein during rotation of the media assembly or locking assembly, but is typically configured to block the locking member from moving beyond a certain position. This in turn prevents the media assembly and locking assembly from being rotated to a position where they may be disengaged from one another.

To illustrate, the ends of the restrictor channel 228 may be positioned such that the media assembly and locking assembly may be blocked or otherwise prevented from rotating to a particular position (while the locking member is engaged to the restrictor channel 228C). When the locking assembly or media assembly rotate the locking member may move freely along the restrictor channel 228C until the locking member contacts an end or other obstruction of the restrictor channel. When such contact is made, further rotation in the same direction may be prevented. It is noted that, like the other channels/guides herein, the restrictor channel 228 may be inset (as shown) or extend from the surface to which it is attached or associated.

In one or more embodiments, the cover 212 and/or connecting plate 208 may be configured to allow the locking pin 260 to pass therethrough. This allows the locking pin 260 to reach and traverse the restrictor channel 228C. For example, an opening may be in the cover 212, the connecting plate 208, or both. The opening in the connecting plate 208 may be curved to allow the locking pin 260 to follow a curve during rotation of the media module. In some embodiments, a separate opening need not be provided because the locking pin 260 may be positioned such that it passes through one of the channels 228A of the connecting plate 208.

It is contemplated that one or more stops (e.g., physical obstructions in the path of the locking member 228C when moving) may also be used to prevent such rotation. These stops may be used independent of a restrictor channel 228C or with a restrictor channel, such as by being positioned in the path of the restrictor channel.

Figure 2H:
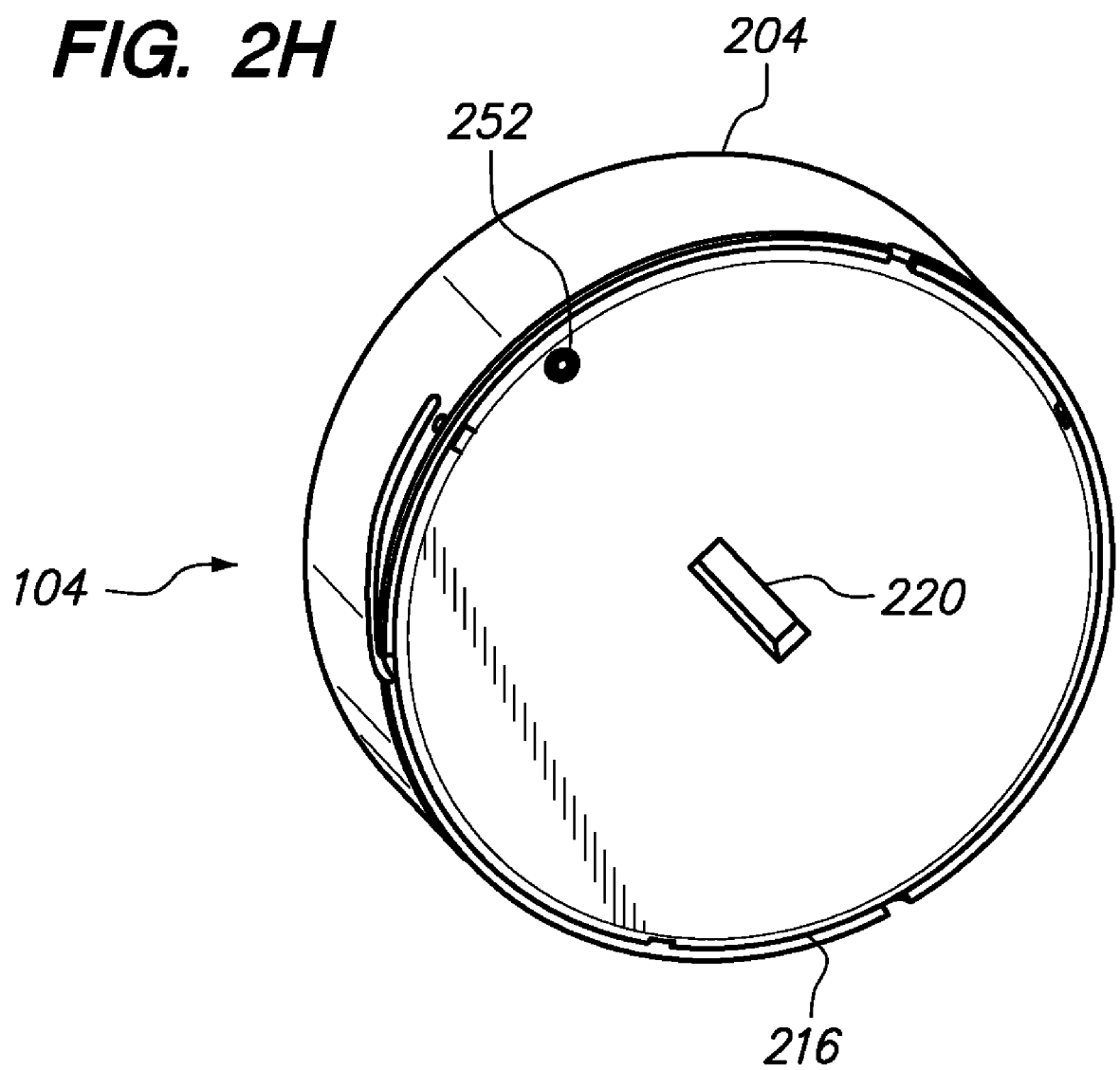
FIG. 2H is a perspective view of an exemplary media module.

Referring to FIGS. 2E and 2H, to allow the locking member 260 to be conveniently removable or disengaged, it is contemplated that the retention mechanism 252 holding the locking member may be externally accessible. For example, the retention mechanism 252 may be accessible on an outer surface of the media assembly. In one or more embodiments, the retention mechanism 252 may be a screw or other twist-lock fastener which may be turned to secure as well as to release itself and the locking member 260. Of course other retention devices 252 may be used to hold the locking member 260 in position, while also allowing the locking member 260 to be removed or disengaged when desired.

It will be understood that the restrictor assembly may have a variety of configurations which may be used to restrict rotation. For example, in one embodiment, the locking member may be held or attached to the cap rather than the enclosure. In this embodiment, one or more restrictor channels, stops, or both may be on the enclosure, such as on the cover of the enclosure. In this manner, a locking member may extend from the top of the cap towards the restrictor channels, stops, or both of the enclosure cover.

In one or more embodiments, the media module may comprise one or more holding elements which hold the locking assembly 240 and media assembly 232 at one or more angles relative to one another. This is beneficial in that for example, the locking assembly 240 and media assembly 232 could be held in position relative to one another such that the media guides 244 and locking guides 120 are aligned to allow a pin or protrusion to enter both the media guides and the locking guides 120 when the media module 104 is being secured to a base 116.

The holding elements may be configured to hold the locking assembly 240 and media assembly 232 such that sufficient rotational force may release the hold and allow the assemblies to rotate relative to one another. For example, in the above example, the user may rotate the locking assembly 240 to release the hold of the holding elements and secure the media module 104 to the base 116.

Holding elements may be configured in various ways. In one embodiment, the holding elements may comprise a ball and socket mechanism, where the socket accepts the ball to releasably hold the ball in position. The ball may extend from the enclosure 216 while the socket is located on an interior portion of the cap 204, or vice versa. In this manner, the ball and socket mechanism may hold the cap 204 and enclosure 216 at an angle relative to one another depending on the positioning of the ball, the socket, or both.

In one or more embodiments, the ball may extend from the curved exterior of the enclosure 216 while the socket may be formed in the curved portion of the cap 204. The ball is beneficial in that it may contact and roll along the curved portion of the cap 204 as the cap is rotated relative to the enclosure 216. Contact between the cap 204 and the enclosure 216 via the ball helps keep the enclosure centered within the cap 204. It is contemplated that the ball may be forced outward by a biasing device, such as a spring in one or more embodiments to ensure contact with the socket and/or the cap 204 as the cap is rotated. It is noted that holding elements may be used in addition to or instead of a retention mechanism in one or more embodiments.

Figure 3A:
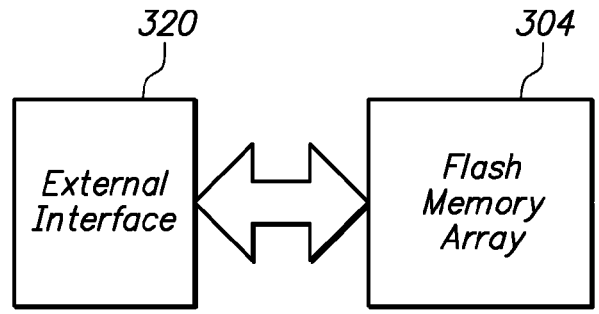
FIG. 3A is a block diagram of an exemplary storage media.
Figure 3B:
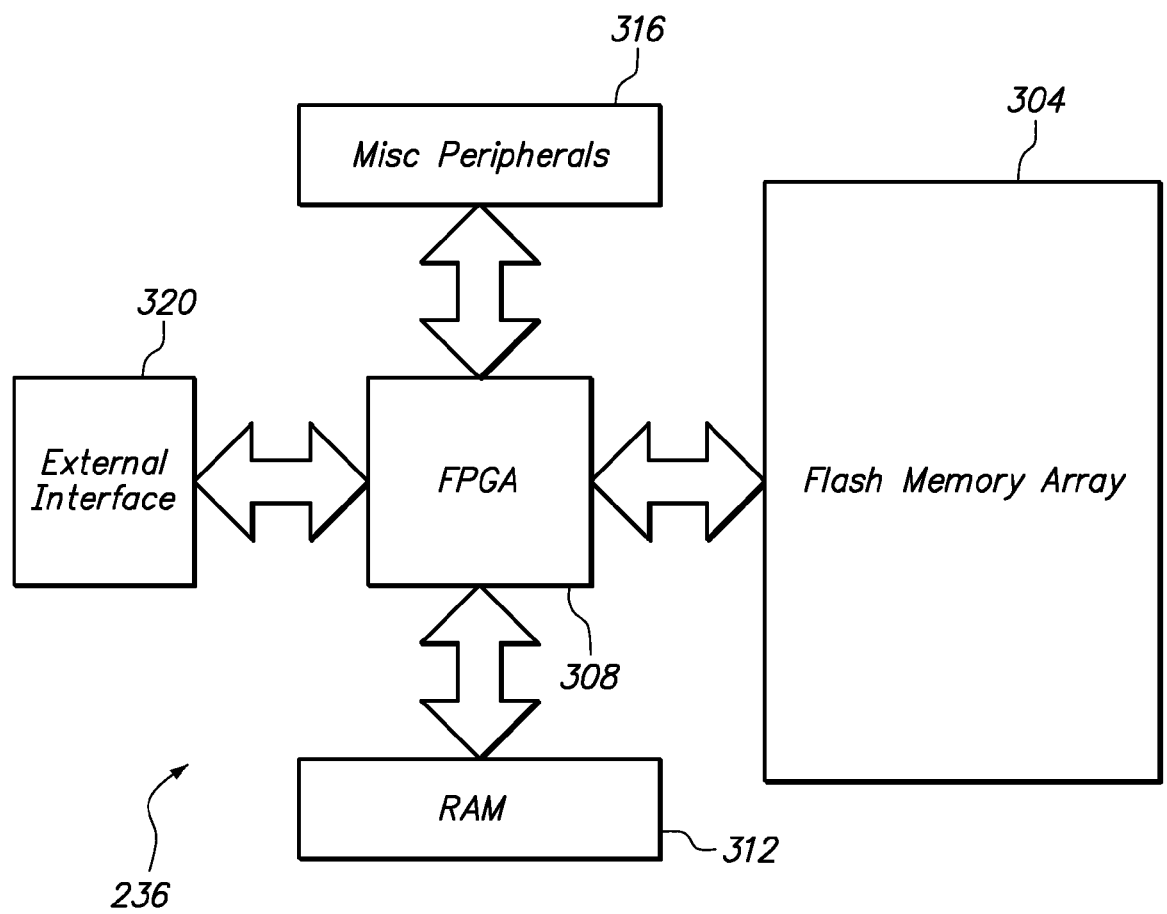
FIG. 3B is a block diagram of an exemplary storage media.

FIGS. 3A-3B illustrates an exemplary configuration of a storage media 236. As can be seen, the storage media 236 may include components other than memory or storage devices. In general, these components facilitate storage and retrieval of information to/from a memory or storage device, however, additional functionality may be provided as well. As shown, the memory or storage device has been labeled as a flash memory array 304. It will be understood that a variety of memory or storage devices, other than flash memory may be used. For example, the memory or storage device may comprise various machine readable storage mediums such as magnetic media, RAM, ROM, optical media, among others.

In one embodiment, the storage media 236 may comprise a flash memory array 304 and an external interface 320 configured to provide access to the array, such as illustrated by FIG. 3A. For instance, the external interface 320 may permit communications between a device and the flash memory array 304 to read from and/or write to the array. The external interface 320 may also allow other communication between the storage media 236 and a device. For instance, as will be described further below, the external interface 320 may allow the storage media 236 to be configured and/or updated through the device.

The external interface 320 may be hardware configured to interface with the base and/or a device that uses the media module. The external interface 320 may comprise various electronic components to properly interface with the device. For example, the external interface 320 may comprise an integrated circuit, microprocessor, microchip, controller, or the like configured to communicate with the device. To illustrate, the external interface 320 may comprise a USB, SATA, IEEE 1394, Ethernet, Fiber Channel, PCI Express, XAUI, RapidIO, Infiniband or other controller to communicate with various devices.

The external interface 320 may also comprise one or more connectors for making a physical connection to allow communication with the device. For example, the external interface 320 may comprise a USB or Firewire plug in one or more embodiments. Typically, the connector will be configured to connect with a device connector 112, such as illustrated in FIG. 1. It is contemplated that a variety of electrical and optical connectors, including proprietary and standardized connectors, may be used in one or more embodiments.

It is noted that the external interface 320 may be configured to support a plurality of communications standards. For example, the external interface 320 may be configured to interface with USB, Firewire, Ethernet, other devices, or various combinations, in one or more embodiments. Alternatively, or in addition, a plurality of external interfaces 320 may be provided to allow the storage media 236 to be used with devices having various ports or communications capabilities. Accordingly, there may be one or more connector configurations to allow physical connections with these devices. Data transfers or other communications to/from the external interface 320 may be bidirectional or may be unidirectional with the direction of the data flow being controlled by an electrical signal or command.

FIG. 3B illustrates another embodiment of the storage media 236. As can be seen, additional components may be included, such as to provide additional features or functionality. In the embodiment, of FIG. 3B for example, the storage media 236 comprises a field programmable gate array (FPGA) 308. It is noted that though referenced herein as an FPGA, other types of integrated circuits, microprocessors, controllers, or the like may be used in lieu of an FPGA in some embodiments. The FPGA 308 is advantageous in that it may be configured and reconfigured by updating one or more instructions or machine readable code that it executes. Typically, the FPGA 308 will be physically configured to store or embody the machine readable code.

In addition or alternatively the FPGA 308 (or other integrated circuit) may execute machine readable code stored on a portion of the flash memory array 304. The flash memory array 304 may also be used as storage for variables, data structures, or the like as may be needed by the machine readable code as it executes. It is noted that RAM 312 may be provided in some embodiments, to store such information. The flash memory array 304 may also be used to store configuration settings or the like for the storage media 236.

In one or more embodiments, the FPGA 308 coordinates access to the flash memory array 304 and other features of the storage media 236. For example, the FPGA 308 may provide requested data from the flash memory array 304 to the external interface 320 for communication with a device. The FPGA 308 may also write data from the external interface 320 to the flash memory array 304. The FPGA 308 may comprise one or more instructions (or execute machine readable code having these instructions), such as read and/or write caching instructions to improve read/write performance of the flash memory array 320. It is contemplated that the FPGA 308 may also or alternatively utilize the RAM 312 for caching data. This is advantageous in that the RAM 312 will typically have higher read/write performance than the flash memory array 320. This is especially beneficial in the film industry where large volumes of video data must be stored and retrieved rapidly.

One or more peripherals 316 may be included in some embodiments. For example, one or more peripherals 316 may be in communication with the FPGA 308 in some embodiments. The peripherals 316 may be configured to provide additional functionality or features. For instance, in one embodiment, the peripherals may be one or more indicators, such as one or more lights, displays, or the like to provide status or other information for the storage media 236. To illustrate, one or more indicators may be included to indicate used/available storage capacity, read/write access to the flash memory array 304, receive/transmit activity on the external interface 320, read/write speed, date information, time information, the like, or a combination thereof. This information may be presented in various ways. For example, the information may be presented by one or more graphics, text, or even with one or more lights. It is contemplated that the one or more indicators may be mounted to the media module, its base, or both.

As the following examples illustrate, a variety of other peripherals 316 may be provided as well. For example, in one embodiment, a battery my be provided such as to power a clock or to ensure data is reliably stored on the flash memory array 304 such as by allowing the storage media 236 to complete writing data even if external power is lost. In another embodiment, a peripheral 316 may be a network communications interface, such as a wireless or wired network interface to allow the data on the flash memory array 304 to be accessed via a network. In yet another embodiment, a peripheral 316 may be a display or screen configured to present data on the flash memory array 304. For example, the display may present videos (as well as audio, text, graphic, and other files) stored on the flash memory array 304.

In one or more embodiments, the one or more peripherals 316 may be built-in to the media module. In other embodiments, the peripherals 316 may be removable. For example, the media module may comprise a peripheral port to allow connections to various peripherals 316. In this manner, a wide variety of peripherals 316 may be used with the media module.

Operation of the mounting system will now be described with regard to FIGS. 4A-4E. In general, these figures illustrate the mounting and dismounting of a media module 104 to a base 116. It is noted that though a particular base 116 has been illustrated, the base may have various configurations, including configurations where the base 116 may be integrated into a device (as will be described further below).

Figure 4A:
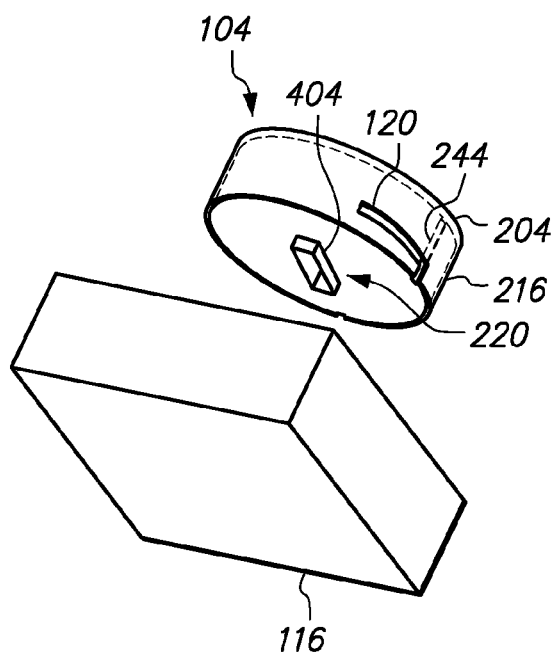
FIGS. 4A-4E illustrating mounting and dismounting with an exemplary mounting system.

FIG. 4A shows how the media module 104 may be positioned relative to the base 116 prior to mounting the media module to the base. As can be seen, the media module 104 will typically be oriented such that a connector 404 of the media module 104 (or the storage media therein) is facing towards the base 116. It is noted that the connector 404 may extend outward from the media module 104 in some embodiments (such as illustrated), while in others the connector 404 may be inset or flush with the surface of the media module. It will be understood that the device connector of the base 116 may be configured accordingly to accept or engage the connector 404.

FIG. 4A also shows that the locking assembly 240 and media assembly 232 of the media module 104 may be aligned to permit the media module to be mounted to the base. For instance, as shown by FIG. 4A, one or more locking guides 120 of the locking assembly 240, or portions thereof, may be aligned with one or more media guides 244 of the media assembly 232. In this manner, the open end of the one or more locking guides 120 may be aligned with the one or more media guides 244. This allows the media module 104 to engage one or more pins of the base 116, as will be described further below.

It is contemplated that the media assembly 232 and the locking assembly 240 may be aligned by the user rotating the assemblies such that the opening of the locking guides 120 are aligned with the media guides 244. Alternatively, or in addition, the assemblies may be configured to automatically align. For example, one or more springs or the like may be used to push or pull the assemblies into alignment. The force provided by the springs may be overcome to twist the locking assembly 240 relative to the media assembly 232, or vice versa. In this manner, the springs align the assemblies when the media module is not mounted. This prepares the media module for subsequent mounting by aligning the assemblies, which allows a user to quickly mount the media assembly.

Figure 4B:
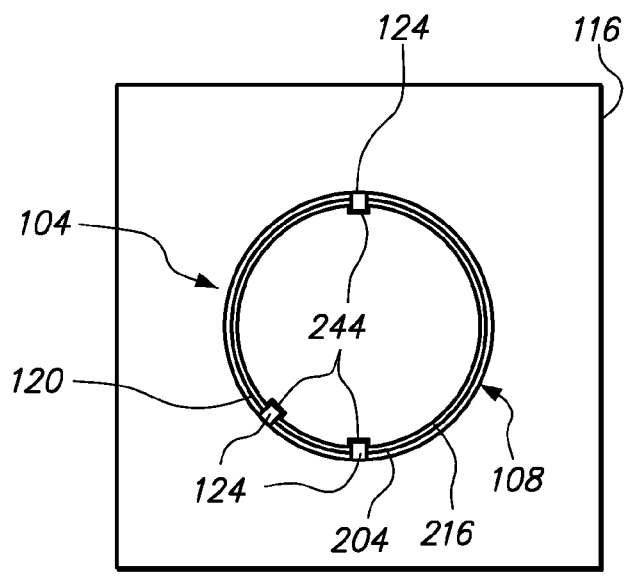

As shown in FIG. 4B, the media module 104 may be aligned with the base 116 prior to mounting the media module. In one or more embodiments, this may be accomplished by aligning the one or more media guides 244 of the media assembly 232 with the one or more pins 124. In addition, the one or more locking guides 120 of the locking assembly 240 may be aligned with the one or more pins 124. Typically, both the locking guides 120 and media guides 244 will be aligned with the pins 124. For example, as described with regard to FIG. 4A, the locking guides 120 and media guides 244 may be aligned to themselves first. This allows the locking guides 120 and the media guides 244 to be simultaneously aligned with the pins 124. Once this alignment is complete, the media module 104 may be, at least partially, inserted into the base 116.

As discussed above with regard to FIG. 1, the pins 124 may be positioned (or otherwise configured) to ensure that the media module 104 is properly oriented as it is mounted to the base 116. This ensures that a proper communications connection can be made between the storage media and a device. FIG. 4B illustrates one configuration of the pins 124 where, as can be seen, the pins have been positioned such that the media module 104 must be at a particular orientation to accept or engage the pins (i.e., to align with the pins). In this orientation, the connector of the media module may also be aligned with the device connector of a base or device such that a communications connection may be properly made. It will be understood that other positions for the pins 124 may be used and that, as stated above, the pins 124 may also have various shapes to ensure the media module 104 is properly oriented during mounting.

Figure 4C:
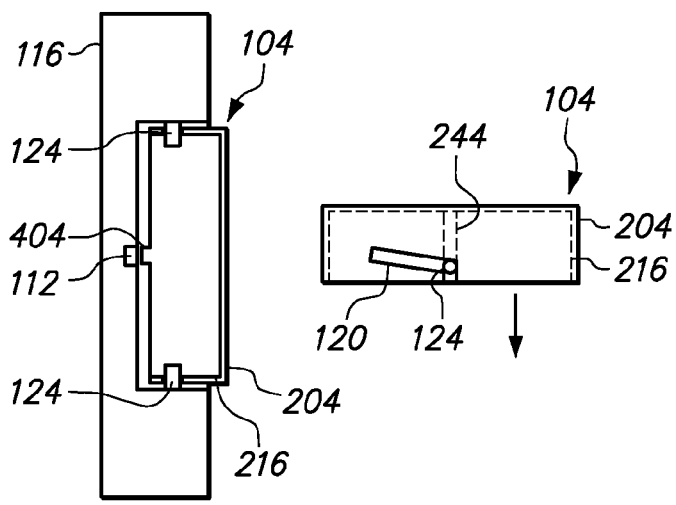

FIG. 4C illustrates the media module 104 partially mounted to the base 116. As can be seen, the pins 124 may be engaged by the locking guides 120 and media guides 244 of the media module 104 at this point. The media module 104 may only be partially inserted into the base 116 at this point because the pins 124 may be contacting a bend or curve of the locking guides 104. As can be seen from FIG. 4C for example, the pins 124 have contacted a bend in the locking guides 120.

Figure 4D:
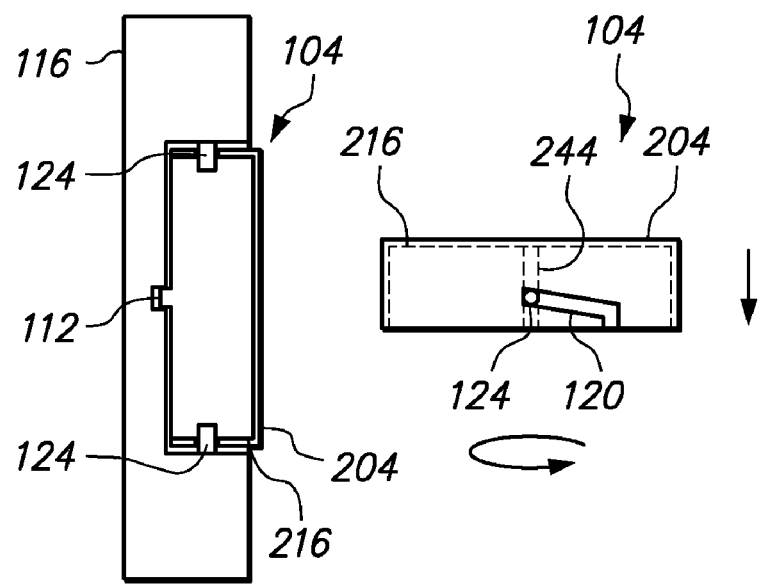

To fully mount the media module 104, the locking assembly 240 may be rotated, such as illustrated in FIG. 4D. In general, this secures the media module 104 to the base 116 and ensures that a proper communications connection is made with the media module's storage media. As can be seen from FIG. 4D for example, the connector 404 of the media module 104 has made a connection with the device connector 112 of the base, allowing access to the storage media in the media module. In addition, the media module 104 has been fully inserted into the base 116 helping to ensure that the connection is maintained and that the media module is secured to the base.

In one or more embodiments, rotation of the locking assembly 240 generally causes the media module 104 to move further into the base 116. Because the locking assembly 240 and media assembly 232 may rotate relative to one another, the alignment between the connector 404 and the device connector 112 may be maintained (ensuring a proper communications connection is made) even while the locking assembly 240 is rotated.

In general, rotation of the locking assembly 240 causes the pins 124 to travel from a first portion of the locking guides 120 into a second portion of the locking guides. For instance, in FIG. 4C, the pins 124 have entered a first portion of the locking guides 120. In FIG. 4D, the locking assembly 240 has been rotated such that the pins 124 may enter a second portion of the locking guides 120 and travel further into the locking guides. The upwardly angled second portion of the locking guides 120 cause the media module 104 to move further into the base 116 as the locking assembly 240 is rotated. In the embodiment of FIG. 4D, this causes the connector 404 to connect with the device connector 112.

It is noted that the first portion and second portion of the locking guides 120 will typically be angled relative to one another to allow the locking assembly to secure the media module 104 to the base 116 when rotated. However, other configurations may also be used. For example, the second portion may be curved to secure the media module 104.

As can also be seen in FIG. 4D, the media assembly 232 remains aligned by the pins 124 as the locking assembly 240 is rotated. This is because the media assembly 232 is guided by the pins 124 and the media assembly's media guides 244 as the media module 104 moves further into the base 116.

The shape or configuration of the media guides 244 guide the media assembly 232 into the base 116 at the proper orientation or alignment. For instance, in FIG. 4D, the media guides 244 are substantially straight. In this configuration the media assembly 232 is guided in a linear fashion into the base 116. Because the media assembly 232 and locking assembly 240 may rotate relative to one another, the media assembly 232 moves straight into the base 116 (forming the proper communications connection), despite the rotation of the locking assembly 240 to secure the media module.

The media module 104 may be considered secured to the base 116 when the pins 124 reach the fullest extent of the locking guides 124, such as illustrated in FIG. 4D. Of course the media module 104 may be secured with the pins 124 at other positions. In general, the clamping force and friction generated by rotating the locking assembly 240 holds the media module 104 securely to the base 116. It is contemplated however, that one or more structures or devices may be used to further secure the media module 104.

For example, in one embodiment, the locking guides 120 may have a notched or other portion which accepts the pins 124. The notched portion may be slight such that they resist unintended movement of the locking assembly 240 but still allow a user to easily rotate the locking assembly to mount and dismount the media assembly 104.

Figure 4E:
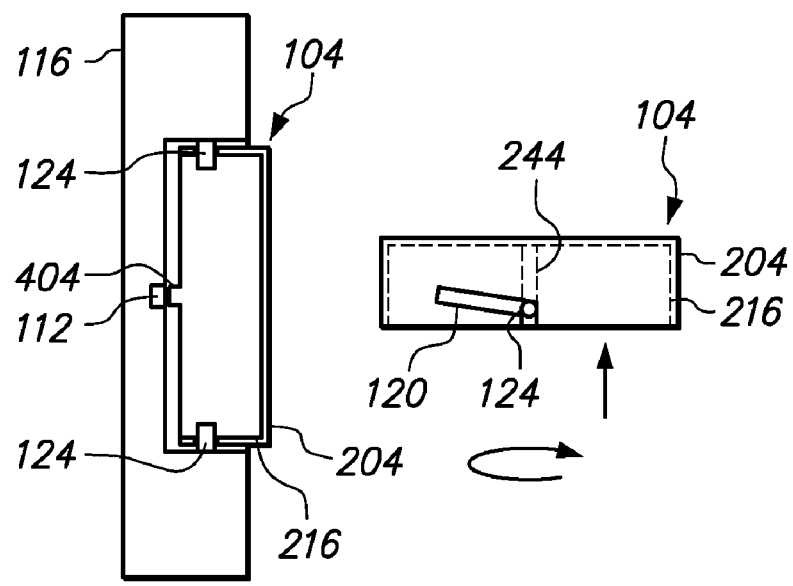

To dismount the media module 104, the locking assembly 240 may be rotated in the opposite direction. This moves the pins 124 back towards the openings of the locking guides 120 such as shown in FIG. 4E. The rotation also causes the media module 104 to move away from the base 116 as the angled portion of the locking guides 120 guide the media module. This may also disconnect the communications connection between the connector 404 and device connector 112 in some embodiments. In this position, it can be seen that the locking guides 120, media guides 244, and pins 124 may be in alignment. The media module 104 may then be removed from the base 116 by moving the media module such that the pins 124 exit the open end of the locking guides 120.

It is noted that in embodiments where the media assembly 232 and locking assembly 240 are configured to automatically align (such as a spring loaded embodiment), once the frictional or other force securing the locking assembly is overcome, the media assembly and locking assembly may automatically move to the aligned position such as shown in FIG. 4C. Stated another way, the locking assembly 240 may automatically rotate to the aligned position (thus moving the media module 104 away from the base 116). The user may then simply remove the media module 104 from the base 116.

As can be seen, the mounting system allows the media module 104 to be quickly mounted and dismounted by a user applying a twisting or rotating motion. The user need not worry about aligning the connector 404 and device connector 112 because the mounting system automatically aligns these components to ensure a proper communications connection is made. To secure the media module 104, the user may simply rotate the locking assembly 240 until there is sufficient compressive/frictional or other force to hold the locking assembly, and thus the media module in place relative to the base 116. The media module 104 may be dismounted just as easily by rotating the locking assembly 240 in the opposite direction. In spring loaded or similar embodiments, the locking assembly 240 may only need to be "loosened" because the spring(s) may automatically align the locking assembly and media assembly 232 for removal from the base 116.

Another benefit of the mounting system is that it permits media modules 104 to be mounted and dismounted with one hand. This is advantageous in that it frees the user's other hand for other tasks. For example, a camera operator may hold his or her camera in a ready position while quickly installing, removing, or swapping media modules 104. This allows recording to occur with minimal downtime.

The mounting system may be used with various devices, including video recording, editing, and playback equipment. It will be understood that other devices that utilize data storage may also use the mounting system. Some exemplary devices that may use the mounting system will now be described with regard to FIGS. 5A-5F.

Figure 5A:
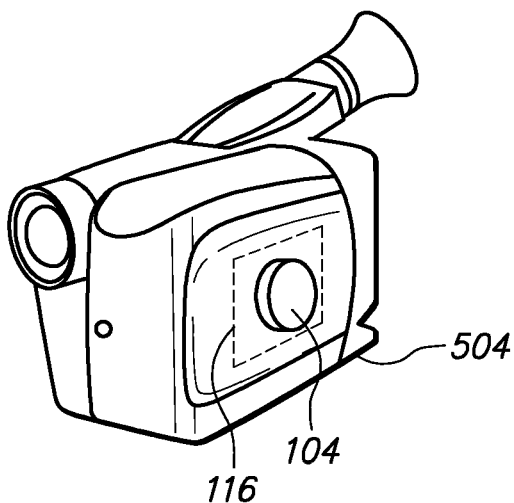
FIGS. 5A-5F illustrating exemplary devices utilizing an exemplary mounting system.

FIG. 5A illustrates a camera, such as a video camera 504, which may utilize the mounting system. As can be seen, the camera 504 may have a base 116 of the mounting system formed integral with a portion of the camera's body. In this manner, a media module 104 may be mounted to the camera 504. This is highly beneficial, especially to professional camera operators or filmmakers, because the mounting system's rapid mounting and dismounting of media modules 104 allows media modules to be quickly swapped. For example, a media module 104 that is full or near full may be quickly exchanged for another media module so that recording may continue.

In some embodiments, the mounting system may be carried by a user. For example, FIG. 5B illustrates a harness or belt which may be worn by a user. The harness 508 may comprise one or more bases 116 for accepting one or more media modules. In some embodiments, the bases 116 may be connected to a device, such as a camera 504, via a cable 512 to allow access to the media modules 104. It is noted that multiple media modules 104 may be combined in some embodiments. For example, as shown, the harness 508 include three mounting systems each capable of mounting a media module 104. This is beneficial in that the additional media modules 104 may be used to increase storage capacity, make multiple copies of a recording, increase read/write performance (such as in a RAID configuration), or a combination thereof.

It is contemplated that the harness 508 may also serve as storage for one or more media modules 104. For example, the harness 508 may comprise one or more bases 116 configured only to physically store media modules 104. Alternatively or in addition, the harness 508 may comprise one or more holsters for storing media modules 104. In this way, the harness 508 keeps extra media modules 104 within reach of the user for quick and convenient access. For example, the user may swap media modules 104 between a camera 504 and the harness 508 without having to first find and retrieve a media module from a remote location or an inconvenient container.

One benefit of the mounting system herein is that media modules 104 may be removed from a camera 504 and quickly mounted on other devices to edit or processes the newly recorded video. For example, FIG. 5C illustrates an editing workstation in the form of a laptop computer 516. In this embodiment, newly recorded or other video may be dismounted from a camera 504 and quickly mounted on the laptop computer 516. An editor may then immediately begin editing or otherwise preparing the video for viewing. This is highly beneficial in live or near-live broadcasts where editing prior to broadcast or viewing is desired. In the meantime, another media module 104 may be mounted to the camera 504 to allow video recording to continue. As can be seen, the mounting system minimizes the time it takes to move video from one device to another. In fact, the transfer time to download (or otherwise electronically transmit) a video may be slower than the time it takes to dismount a media module 104 and re-mount the media module to another device.

Figure 5D:
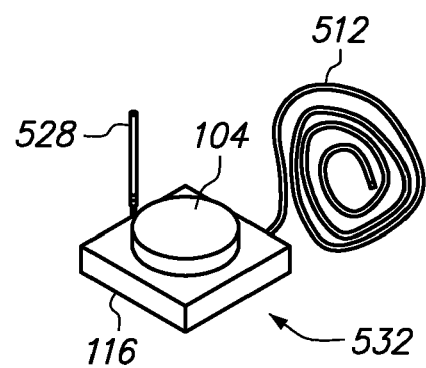
Figure 5B:
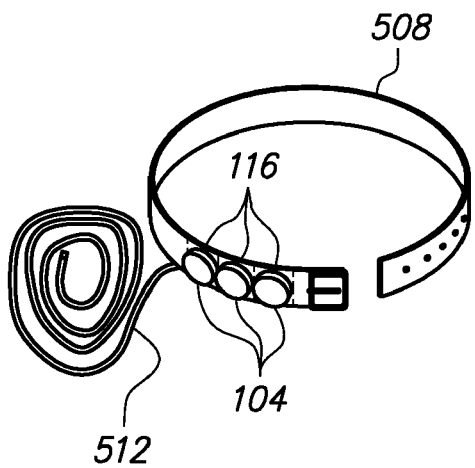

FIG. 5D illustrates a module reader 532 comprising a base 116 for accepting one or more media modules 104. The reader 532 may be configured as a device for providing read/write access to the storage media in the media modules 104. For example, the reader 532 may comprise a cable 512 for connecting the reader to cameras, computers, or other devices. Alternatively or in addition, the reader 532 may comprise a wireless transceiver 528 to provide wireless access to the media modules 104. It is contemplated that the reader 532 may be configured to share the media modules with multiple devices at once, such as via a wired or wireless connection or network.

Figure 5E:
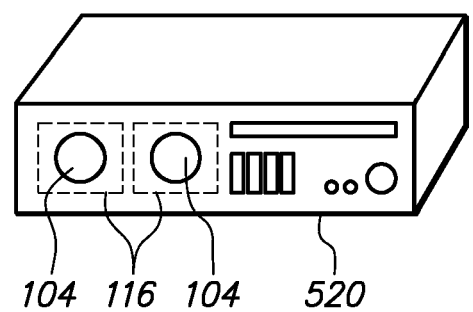
Figure 5C:
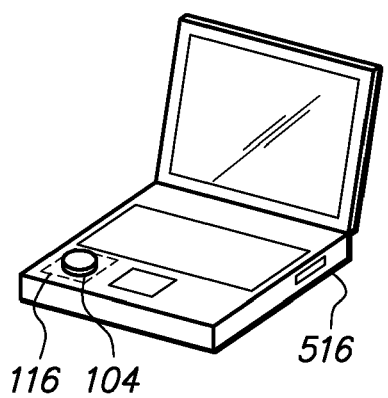

FIG. 5E illustrates exemplary video editing hardware 520 that may utilize the mounting system. As can be seen, the editing hardware 520 may comprise one or more bases 116 (in this case two bases) for accepting various media modules 104. The editing hardware 520 may be configured to edit videos on the media modules 104, make copies of media modules, play the media modules, etc. . . . The editing hardware 520 may comprise one or more storage devices as well. For example, the editing hardware 520 may comprise one or more hard drives or the like to offload video data from the media modules 104. The media modules 104 may then be returned to use. Alternatively or in addition, the storage devices may permit data from the media modules 104 to be stored on other media. For example, the storage devices may be DVD, CD, BluRay, or other drives configured to write data to various media.

Figure 5F:
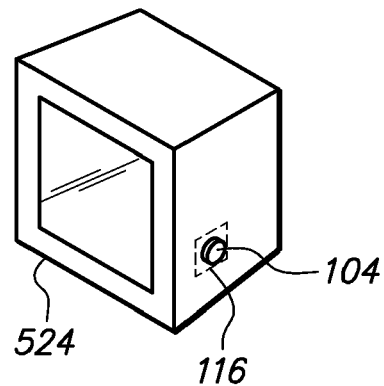

It is contemplated that the mounting system may be integrated or used with playback devices as well. For example, FIG. 5F illustrates a display screen 524 configured with a base 116. In this manner, videos may be directly played by the display screen 524 by mounting a media module 104 on the screen's base 116. To view other videos, various media modules 104 may be mounted to the display screen 524 via the base 116. This is beneficial in that rather than transferring video data to a playback device, the video may be quickly moved to the playback device. For example, newly recorded and/or edited video may be dismounted from the base 116 of one device and mounted on the base of a playback device for immediate viewing/review. This speed allows the video to be quickly prepare and reviewed at least once prior to being distributed or viewed by the video's intended audience.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A mounting system for storage media comprising:
a storage media configured to store video data;
at least one connector in electrical communication with the storage media;
an enclosure configured to contain the storage media, the enclosure comprising one or more guides, the one or more guides configured to align with one or more corresponding pins on a video data source or video data reader to align the at least one connector of the storage media with at least one corresponding connector on a video data source or video data reader;
a cap comprising a top, one or more sides, an open portion opposing the top and one or more locking guides configured as part of the one or more sides, the open portion configured to accept at least a portion of the enclosure, the one or more locking guides configured to engage the one or more pins, wherein the cap is rotatably mounted to the enclosure; and
a plate between the enclosure and the cap, the place configured in combination with the enclosure to form a space containing the storage media.

2. The mounting system of claim 1, wherein the cap is rotatably mounted to the enclosure via the plate.

3. The mounting system of claim 2, wherein the plate comprises one or more curved channels and the enclosure comprises one or more connecting pins, the one or more curved guides configured to guide the rotation of the cap, wherein the one or more curved channels engage the one or more connecting pins to rotatably mount the cap to the enclosure.

4. The mounting system of claim 1, wherein the one or more locking guides comprise a first portion and a second portion, the first portion configured to align with at least a portion of the one or more guides, and the second portion is angled relative to the first portion.

5. The mounting system of claim 1, wherein the one or more locking guides comprise a first portion and a second portion, the first portion configured to align with at least a portion of the one or more guides, the second portion having a curved shape.

6. The mounting system of claim 1, wherein the one or more guides are straight.

7. The mounting system of claim 1, wherein the enclosure comprises an opening to allow the at least one connector or the at least one corresponding connector to pass therethrough.

8. The mounting system of claim 1, wherein the cap is cylindrical in shape.

9. A mounting system for storage media comprising:
an enclosure configured to store a storage media;
one or more media guides on an outer surface of the enclosure, the one or more media guides configured to align at least one connector of the storage media with at least one device connector and to guide the connector to the at least one device connector to enable communication between the at least one connector of the storage media and the at least one device connector;
a cap comprising a top, one or more sides, and an open portion opposite the top to accept the enclosure;
one or more locking guides formed in the cap, the one or more locking guides having a first portion configured to align with the one or more media guides and a second portion configured to secure the enclosure to a base; and
a mount between the cap and the enclosure, the mount configured to rotatably mount the cap to the enclosure, wherein the enclosure is mounted within the open portion of the cap.

10. The mounting system of claim 9, wherein the one or more media guides are straight.

11. The mounting system of claim 9, wherein the second portion of the one or more locking guides is angled relative to the first portion of the one or more locking guides.

12. The mounting system of claim 9, wherein the enclosure and cap is cylindrical in shape.

13. The mounting system of claim 9, wherein the enclosure comprises at least one opening through which the at least one connector passes to connect to the at least one device connector.

14. The mounting system of claim 9 further comprising a mounting base comprising a coupler having one or more pins extending therefrom, the coupler configured to accept at least a portion of the cap and enclosure, the one or more pins configured to engage the one or more media guides to align and guide the at least one connector to the at least one device connector and configured to engage the one or more locking guides to mount and secure the enclosure to the mounting base.

15. The mounting system of claim 14 wherein the mounting base is part of video camera or media reader configured to connect to a computer.

16. The mounting system of claim 9 further comprising:
at least one base comprising a coupler having one or more pins extending therefrom, the coupler configured to accept at least a portion of the cap and enclosure, the one or more pins configured to engage the one or more locking guides to mount the enclosure to the base; and
a harness configured to be worn by a user, the at least one base attached to the harness.

17. A method of mounting a storage media to an electronic device having a base comprising:
aligning one or more media guides of an enclosure of a media module with one or more pins of the base;
aligning at least a portion of one or more locking guides of a cap of the media module with the one or more pins of the base;
inserting at least a portion of the cap into a portion of the base, wherein a first portion of the one or more locking guides and the one or more media guides engage the one or more pins;
rotating the cap in a first direction to move the one or more pins into a second portion of the one or more locking guides to mount the enclosure to the base, wherein the cap is rotated relative to the base and the enclosure; and
while rotating the cap, also guiding the enclosure into the base with the one or more media guides, wherein at least one connector of the media module is guided to at least one device connector of the base to form a communication connection between the at least one connector and the at least one device connector.

18. The method of claim 17, wherein rotating the cap in the first direction comprises moving the one or more pins into an angled second portion of the one or more locking guides.

19. The method of claim 17, wherein rotating the cap in the first direction comprises moving the one or more pins into a curved second portion of the one or more locking guides.

20. The method of claim 17, wherein the method comprises a method for dismounting the storage media from the electronic device comprising:
rotating the cap in a second direction to move the one or more pins out of the second portion of the one or more locking guides; and
removing the one or more pins from the one or more locking guides and the one or more media guides.

* * * * *